United States Patent
Cho et al.

(10) Patent No.: US 7,589,421 B2
(45) Date of Patent: Sep. 15, 2009

(54) HEAT-RADIATING SEMICONDUCTOR CHIP, TAPE WIRING SUBSTRATE AND TAPE PACKAGE USING THE SAME

(75) Inventors: Young-Sang Cho, Suwon-si (KR); Dong-Han Kim, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 397 days.

(21) Appl. No.: 11/488,057

(22) Filed: Jul. 18, 2006

(65) Prior Publication Data
US 2007/0152329 A1 Jul. 5, 2007

(30) Foreign Application Priority Data
Dec. 29, 2005 (KR) .................... 10-2005-0133623

(51) Int. Cl.
*H01L 23/48* (2006.01)
(52) U.S. Cl. ..................... 257/734; 257/786
(58) Field of Classification Search ........... 257/786, 257/734; 438/612, 666
See application file for complete search history.

(56) References Cited

U.S. PATENT DOCUMENTS

| 6,057,596 | A | * | 5/2000 | Lin et al. ................. 257/697 |
| 6,163,071 | A | * | 12/2000 | Yamamura ................. 257/691 |
| 6,403,896 | B1 | * | 6/2002 | Ma et al. .................... 174/261 |
| 6,650,014 | B2 | * | 11/2003 | Kariyazaki ................ 257/737 |

FOREIGN PATENT DOCUMENTS

| JP | 07-253591 | 10/1995 |
| JP | 09-258249 | 10/1997 |
| JP | 09-260579 | 10/1997 |

\* cited by examiner

*Primary Examiner*—Roy K Potter
(74) *Attorney, Agent, or Firm*—Harness, Dickey & Pierce, P.L.C.

(57) ABSTRACT

A semiconductor chip, a tape package of the chip and a tape wiring substrate of the chip may be configured so as to effectively radiate heat generated from the chip externally through certain wiring patterns connected to certain pads. In an example, the chip may include a plurality of input pads along at least one edge of an active surface. The input pads may include power pads and ground pads. The chip may include a plurality of output pads along edges of the active surface, outside of the input pads. The power pads and the ground pads may be located at a central area of the at least one edge.

34 Claims, 8 Drawing Sheets
(1 of 8 Drawing Sheet(s) Filed in Color)

HEAT-RADIATING SEMICONDUCTOR CHIP, TAPE WIRING SUBSTRATE AND TAPE PACKAGE USING THE SAME

PRIORITY STATEMENT

This U.S. non-provisional application claims benefit of priority under 35 U.S.C. §119 to Korean Patent Application No. 2005-133623, filed on Dec. 29, 2005 in the Korean Intellectual Property Office (KIPO), the entire contents of which are incorporated herein by reference.

BACKGROUND OF THE INVENTION

1. Field of the Invention

Example embodiments of the present invention relate in general to a heat-radiating semiconductor chip, a tape wiring substrate and a tape package using the same.

2. Description of the Related Art

With the development of the flat display industry, for example liquid crystal displays (LCD) for portable phones, thin-film transistor (TFT/LCDs) for computers and plasma display panels (PDPs) for domestic use, tape packages as a component of flat display devices have been developing. As the flat display devices move towards smaller sizes, the tape packages accordingly require a finer pitch of its wiring patterns.

The tape packages use a tape wiring substrate and include tape carrier packages (TCPs) and chip on film (COF) packages. The TCPs include a tape wiring substrate with a window and a semiconductor chip mounted on the tape wiring substrate using an inner lead bonding (ILB) method. The COF packages may include a solid tape wiring substrate and a semiconductor chip mounted on the tape wiring substrate using a flip chip bonding process.

In the COF packages, input and output terminal patterns act as external connection terminals instead of solder balls. The input and output terminal patterns are directly attached to a printed circuit board or a display panel.

FIG. 1 is a plan view of a conventional tape package 100; FIG. 2 is a cross-sectional view taken along the line II-II of FIG. 1; FIG. 3 is a plan view of a semiconductor chip 10 of the tape package 100 in FIG. 1.

Referring to FIGS. 1 to 3, the COF package 100 includes a tape wiring substrate 20 and the semiconductor chip 10 flip chip bonded to the tape wiring substrate 20 via bumps 18. An encapsulant 30 seals a flip chip bonded portion through an underfill process. The bumps 18 connect the semiconductor chip 10 to input and output wiring patterns 23 and 28 of the tape wiring substrate 20.

The semiconductor chip 10 includes input pads 12 and output pads 16 along the edges of an active surface 11. Logic cells are provided in a central area of the active surface 11. The input pads 12 are arranged along one longer side of the semiconductor chip 10. The input pads 12 include a plurality of signal pads 13, power pads 14 and ground pads 15. The power pads 14 and ground pads 15 are arranged so that power and ground is uniformly provided over the semiconductor chip 10.

FIG. 4 is a temperature distribution diagram of heat occurring during operation of the tape package 100 of FIG. 1. Referring to FIG. 4, a majority of heat is generated from the central area of the semiconductor chip 10 where the logic cells are located. The heat is radiated to a printed circuit board 40 and a panel 50 through the input and output wiring patterns 23 and 28 connected to the semiconductor chip 10.

The input and output wiring patterns 23 and 28 are formed at a uniform pitch and a uniform width, regardless of the route of heat, thereby resulting in inefficient heat radiation. The dispersed arrangement of the power pads 14 and ground pads 15 can result in an increased length of the input wiring patterns 23, which could reduce the heat radiation capability of the tape package 100. Generally, the input wiring patterns 23 which are arranged in a peripheral area of the semiconductor chip 10 are longer than those input wiring patterns 23 arranged in a central area of the semiconductor chip 10. Therefore, the input wiring patterns 23 on the periphery that are connected to the power pads 14 and ground pads 15 have a longer length than those arranged at the central area of the semiconductor chip 10. As a result, the route of heat through the input wiring patterns 23 connected to the power pads 14 and ground pads 15 may be increased in an effort to reduce the heat radiation capability. Further, as the frequency and voltage of the semiconductor chip 10 increases, more heat is generated from the semiconductor chip 10.

SUMMARY OF THE INVENTION

An example embodiment of the present invention is directed to a semiconductor chip. The chip includes a plurality of input pads along at least one edge of an active surface. The input pads include power pads and ground pads. The chip includes a plurality of output pads along edges of the active surface, outside of the input pads. The power pads and the ground pads are located at a central area of the at least one edge.

Another example embodiment of the present invention is directed to a semiconductor chip. The chip includes a plurality of power pads and ground pads located at a central area of one edge of an active surface. The input pads include power pads and ground pads. The chip includes a plurality of output pads along a periphery of the active surface.

Another example embodiment of the present invention is directed to a tape package. The package includes a semiconductor chip including input pads and output pads along edges of an active surface. The input pads are located at one edge of the active surface and include power pads and ground pads that are centrally located at the one edge. The tape package includes a tape wiring substrate and an encapsulant sealing a bonded portion of the semiconductor chip and tape wiring substrate.

Another example embodiment of the present invention is directed to a tape wiring substrate for a semiconductor chip. The substrate includes a wiring pattern connected to a plurality of input pads and output pads of the semiconductor chip via a bump. The wiring pattern includes a plurality of input wiring patterns and a plurality of output wiring patterns. The substrate includes a protection layer exposing ends of the input and output wiring patterns. Each of the input wiring patterns extends in an approximately straight line.

BRIEF DESCRIPTION OF THE DRAWINGS

The patent or application file contains at least one drawing executed in color. Copies of this patent or patent application publication with color drawing(s) will be provided by the Office upon request and payment of the necessary fee The example embodiments of the present invention will be readily understood with reference to the following detailed description thereof provided in conjunction with the accompanying drawings, wherein like reference numerals designate like structural elements.

The drawings are for illustrative purposes only and are not drawn to scale. The spatial relationships and relative sizing of the elements illustrated in the various embodiments may have been reduced, expanded or rearranged to improve the clarity of the figures with respect to the corresponding description. The figures, therefore, should not be interpreted as accurately reflecting the relative sizing or positioning of the corresponding structural elements that could be encompassed by an actual device manufactured according to the example embodiments of the invention.

DETAILED DESCRIPTION OF THE EXAMPLE EMBODIMENTS

Figure 1:
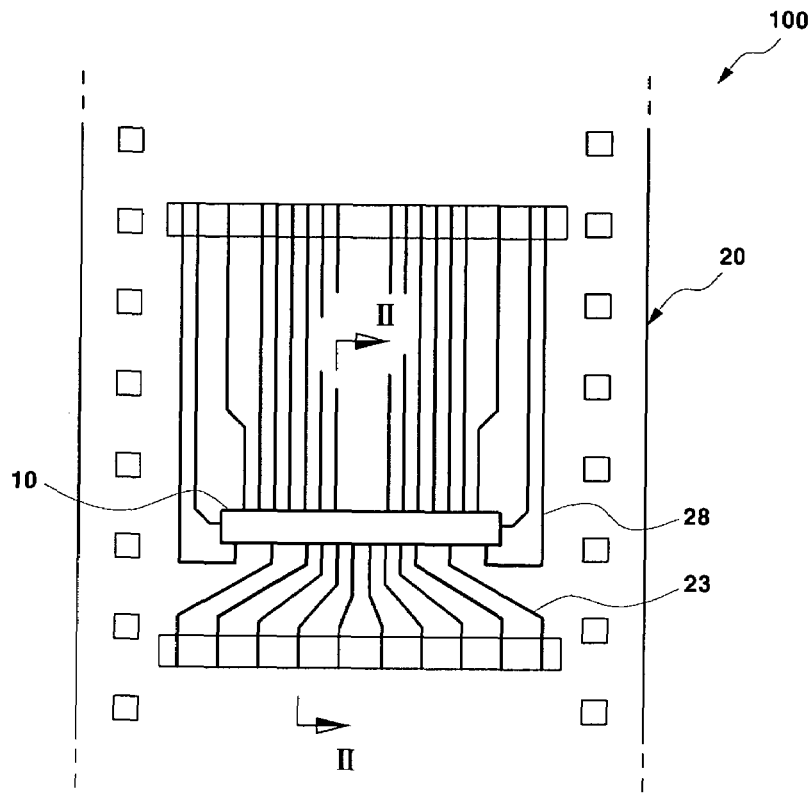
FIG. 1 is a plan view of a conventional tape package.
Figure 2:
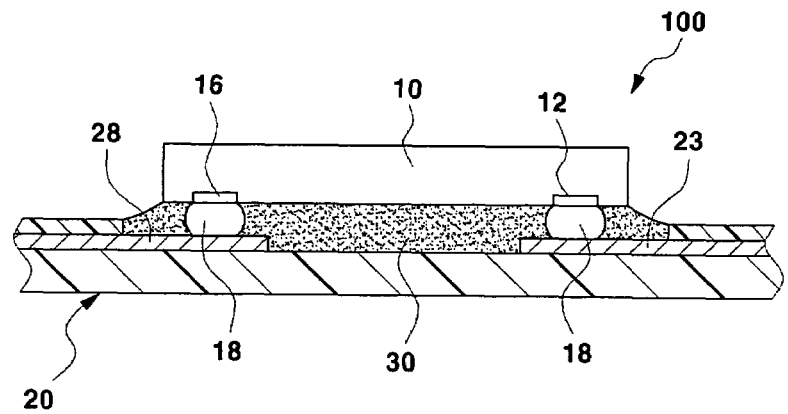
FIG. 2 is a cross-sectional view taken along the line II-II of FIG. 1.
Figure 3:
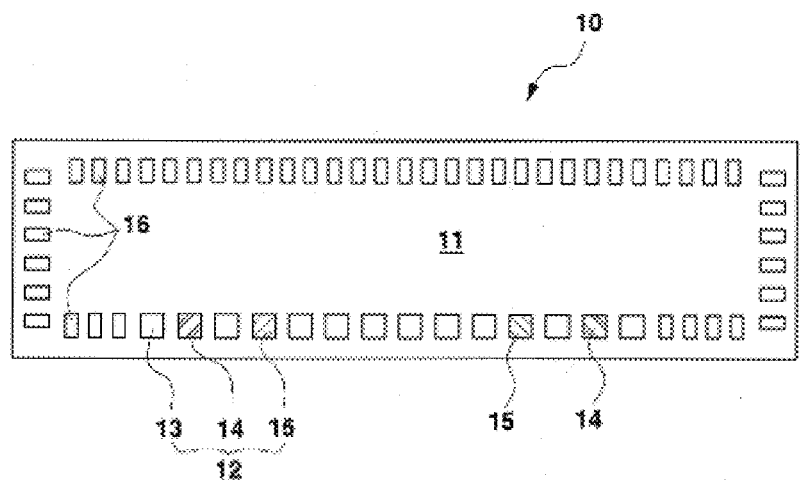
FIG. 3 is a plan view of a semiconductor chip of the tape package of FIG. 1.
Figure 4:
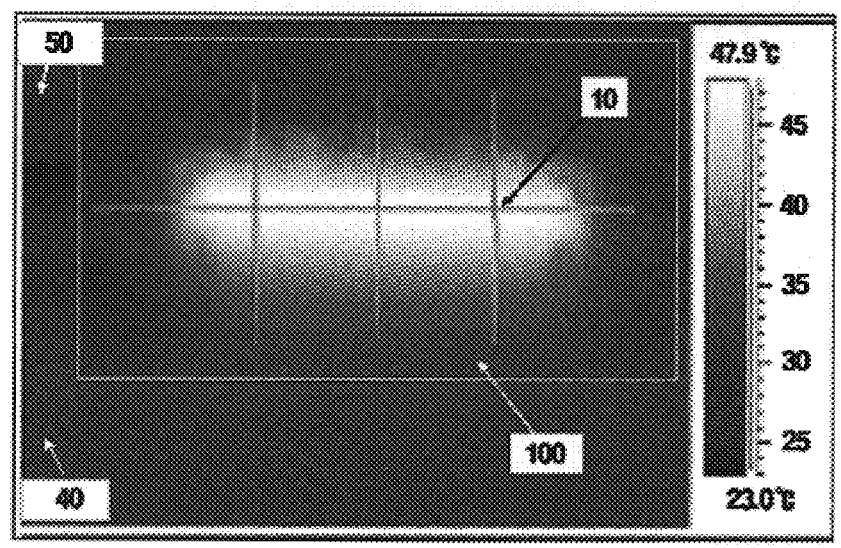
FIG. 4 is a temperature distribution diagram of heat occurring during operation of the tape package of FIG. 1.

Example, non-limiting embodiments of the present invention will now be described more fully hereinafter with reference to the accompanying drawings. This invention may, however, be embodied in many different forms and should not be construed as limited to the example embodiments set forth herein. Rather, the disclosed example embodiments are provided so that this disclosure will be thorough and complete, and will fully convey the scope of the invention to those skilled in the art. The present invention may be employed in varied and numerous embodiments without departing from the scope of the invention.

It should be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements are exaggerated relative to other elements.

Further, well-known structures and processes are not described or illustrated in detail to avoid obscuring the present invention. Like reference numerals are used for like and corresponding parts of the various drawings.

Figure 5A:
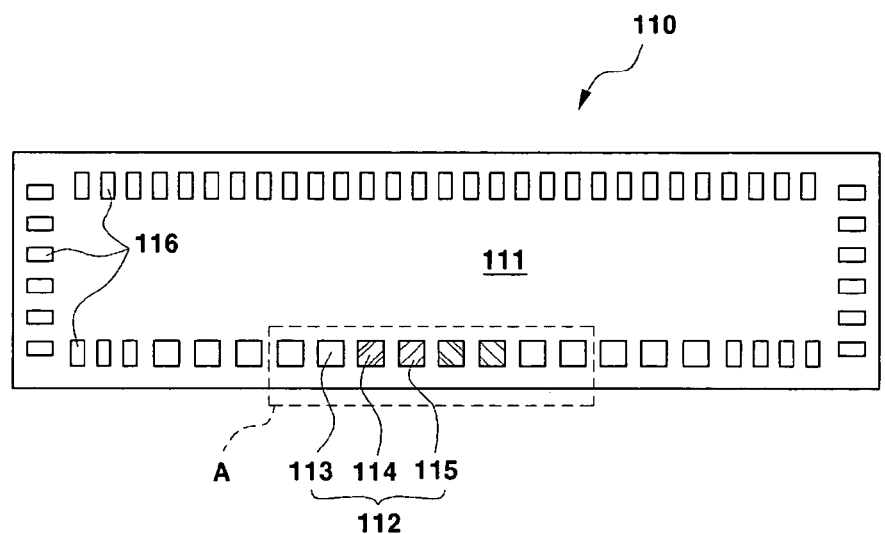
FIG. 5A is a plan view of a semiconductor chip in accordance with an example embodiment of the present invention.
Figure 5B:
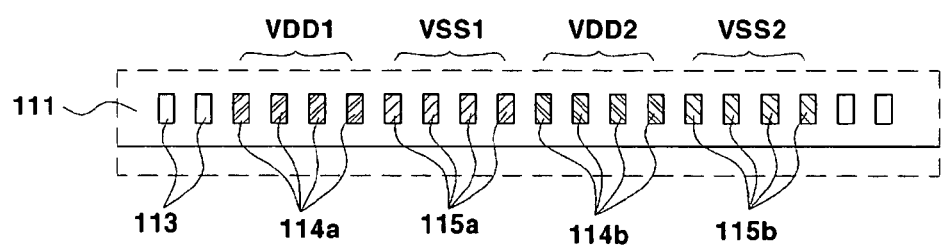
FIG. 5B is a partially enlarged view of section A in FIG. 5A.

FIG. 5A is a plan view of a semiconductor chip 110 in accordance with an example embodiment of the present invention. FIG. 5B is a partially enlarged view of section A in FIG. 5A. Although FIG. 5A shows a single power pad 113 and a single ground pad 115 for simplicity of illustration, a group of four power pads 113 and a group of four ground pads 115 may be provided, as shown in FIG. 5B, for example.

Referring to FIGS. 5A and 5B, the semiconductor chip 110 includes a plurality of input pads 112 and output pads 116 arranged along edges of an active surface 111. The input pads 112 may be arranged along one edge of the active surface 111.

The input pads 112 may include power pads 114 and ground pads 115. The power pads 114 and ground pads 115 may be located in a central area of one edge shown in FIG. 5A centrally along the lower edge. The length of input wiring patterns connected to the input pads 112 may be reduced to immediately radiate heat away from the semiconductor chip 110.

For example, the semiconductor chip 110 may have an active surface 111 with opposing longer sides. The input pads 112 comprising signal pads 113, power pads 114 and ground pads 115) may be arranged along one longer side of the active surface 111. The power pads 114 and the ground pads 115 may be located in a central area of the one longer side. The signal pads 113 may be arranged at either side of the central area where the power and ground pads 114 and 115 are provided.

Each of the power pads 114 and ground pads 115 may be grouped according to the used voltage. For example, if the semiconductor chip 110 uses 1.5 V (V1) and 5 V (V2), power pads 114a using 1.5 V may be VDD1, power pads 114b using 5 V may be VDD2, ground pads 115a using 1.5 V may be VSS1 and ground pads 115b using 5 V may be VSS2. VDD1 may be located adjacent to VSS1, and VDD2 may be located adjacent to VSS2. Although this example embodiment shows the arrangement in the order of VDD1, VSS1, VDD2 and VSS2, the order may vary. For example, other possible orders include, VDD1, VSS1, VSS2 and VDD2, VSS1, VDD1, VSS2 and VDD2, VDD2, VSS2, VDD1 and VSS1, VDD2, VSS2, VSS1 and VDD1, or VSS2, VDD2, VSS1 and VDD1. Although this example embodiment shows a group of four power pads and a group of four ground pads, the number of power pads or ground pads may not be limited in this regard.

The output pads 116 may be arranged along the edges of the active surface 111 excluding the input pad arrangement. Although this example embodiment shows the input and output pads 112 and 116 arranged along the edges of the active surface 111, the input pads 112 may be arranged along one longer side of the active surface 111 and the output pads 116 may be arranged along the opposite longer side of the active surface 111.

Figure 6:
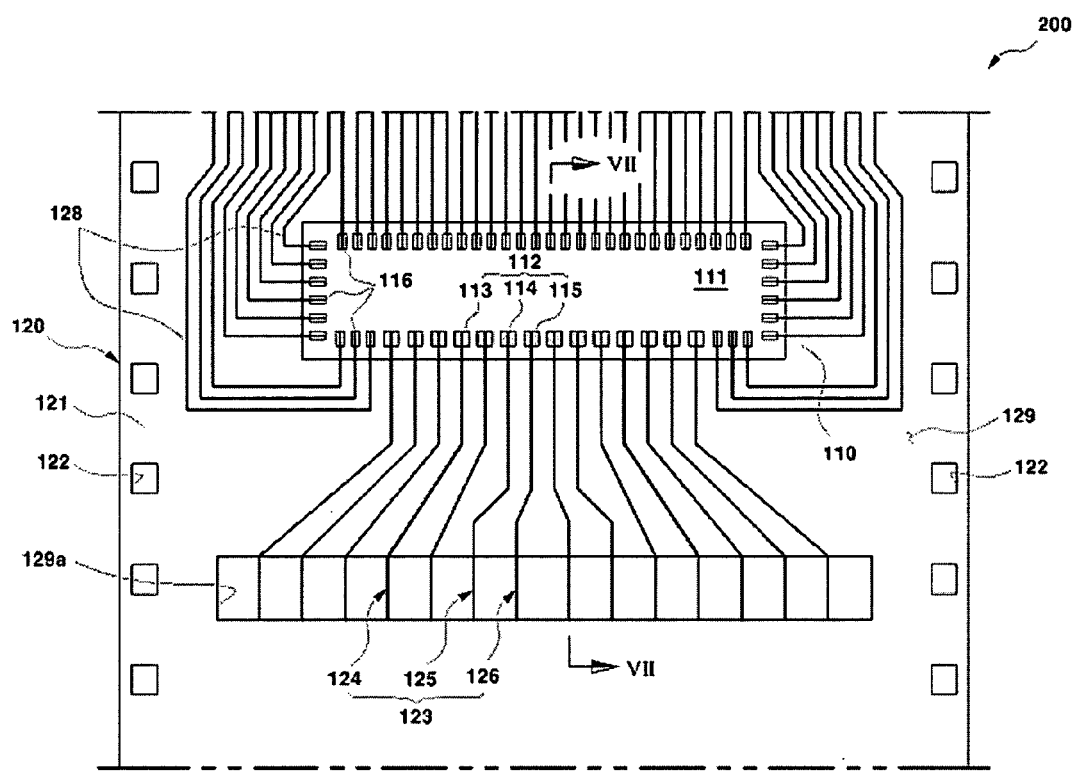
FIG. 6 is a plan view of a tape package having the semiconductor chip of FIG. 5 in accordance with an example embodiment of the present invention.
Figure 7:
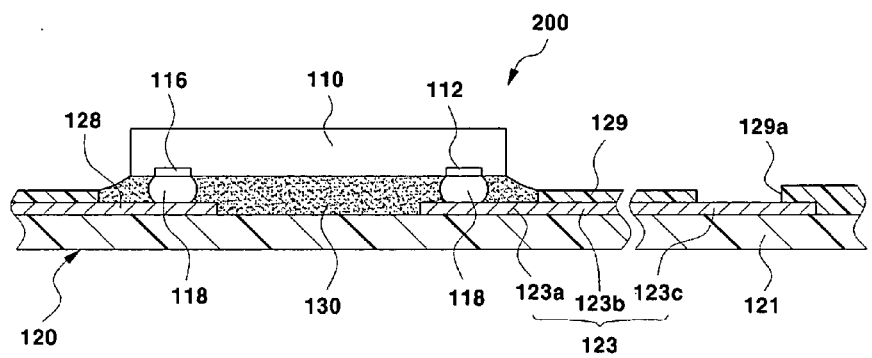
FIG. 7 is a cross-sectional view taken along the line VII-VII of FIG. 6.

FIG. 6 is a plan view of a tape package 200 having the semiconductor chip 110 of FIG. 5 in accordance with an example embodiment of the present invention; and FIG. 7 is a cross-sectional view taken along the line VII-VII of FIG. 6.

Referring to FIGS. 6 and 7, the tape package 200 as a COF package may include a tape wiring substrate 120 and the semiconductor chip 110 flip chip bonded to the tape wiring substrate 120 using bumps 118. An encapsulant 130 may seal a flip chip bonded portion through an underfill process. The semiconductor chip 110 is flip chip bonded to the tape wiring substrate 120, such that a portion of input pads 112 and output pads 116, and a portion of wiring patterns 123 and 128 practically underlie the semiconductor chip 110. FIG. 6 thus illustrates the interconnections between the input pads 112 and output pads 116 and the wiring patterns 123 and 128.

The tape wiring substrate 120 may have a base film 121, with the wiring patterns 123 and 128 provided on the base film 121. The wiring patterns 123 and 128 may be formed by patterning a metal layer on an upper surface of the base film 121. The base film 121 may have a chip mounting area in the center thereof. Sprocket holes 122 may be arranged along the opposing edges of the base film 121 at a regular interval. The chip mounting area may be perpendicular to the direction of the sprocket hole arrangement. The base film 121 may be formed from an insulating synthetic resin, for example a polyimide resin, an acrylic resin, a polyether-nitrile resin, a polyether-sulfone resin, a polyethylene terephthalate resin, polyethylene naphthalate resin or a polyvinyl chloride resin. In one example, a polyimide resin is used as the base film 121. In another example, the tape package 200 is applied to a mounting environment, a sprocket hole forming area may be removed and a package area may be substantially used as the base film 121.

The wiring patterns 123 and 128 may be formed using a Cu foil on the upper surface of the base film 121 and patterning the Cu foil using a photolithographic process. The wiring patterns 123 and 128 may be connected to the input pads 112 and output pads 116 via bumps 118. The wiring patterns 123 and 128 may be arranged around the chip mounting area. The wiring patterns 123 include input wiring patterns 123 extending to one side of the base film 121 from the chip mounting area, and output wiring patterns 128 extending to the other side of the base film 121 from the chip mounting area. The input wiring patterns 123 and output wiring patterns 128 may run parallel to the sprocket hole arrangement. The input wiring pattern 123 may be connected to a printed circuit board and the output wiring pattern 128 may be connected to a panel.

The input wiring patterns 123 may include power wiring patterns 125 connected to power pads 114, ground wiring patterns 126 connected to the ground pads 115 and signal wiring patterns 124 connected to signal pads 113. Since the power wiring patterns 125 and the ground wiring patterns 126 are located in the central area of the base film 121, the length of a given power wiring pattern 125 and a given ground wiring pattern 126 may be shorter than the length of a given signal wiring pattern 124.

The wiring patterns 123, 128 may be formed from materials having desirable electrical conductivity, such as Cu, Ni, Au, a solder or an alloy thereof. Although this example embodiment shows the wiring patterns 123 and 128 provided on an upper surface of the base film 121, the wiring patterns 123, 128 may be provided on a lower surface of the base film 121 or both of the upper and lower surfaces.

A protection layer 129, for example a solder resist may be provided on the base film 121 to protect the wiring patterns 123, 128. The input pads 112 and output pads 116 and ends of the wiring patterns 123, 128 may be exposed through the protection layer 129.

The input wiring pattern 123 may comprise a substrate pad 123a, an intermediate portion 123b and a connection pad 123c. The substrate pad 123a may be connected to the input pad 112 via bump 118. The intermediate portion 123b may extend from the substrate pad 123a and covered with the protection layer 129. The connection pad 123c may extend from the intermediate portion 123b and be exposed through the protection layer 129. The connection pad 123c may be connected to a printed circuit board. The protection layer 129 may have an opening 129a through which the connection pads 123c of the input wiring patterns 123 may be exposed. In the same manner as the input wiring patterns 123, the output wiring patterns 128 may comprise a substrate pad, an intermediate portion and a connection pad.

In this example embodiment, the power pads 114 and ground pads 115 may be arranged in the central area at one edge on the active surface 111 of the semiconductor chip 110. The power wiring patterns 125 and ground wiring patterns 126 have a relatively shorter length, and may be connected to the power pads 114 and ground pads 115. Heat generated from the semiconductor chip 110 may therefore be radiated through the power wiring patterns 125 and ground wiring patterns 126. Although this example embodiment illustrates a COF package as the tape package 200, TCPs may be applied to the tape package 200.

Figure 8:
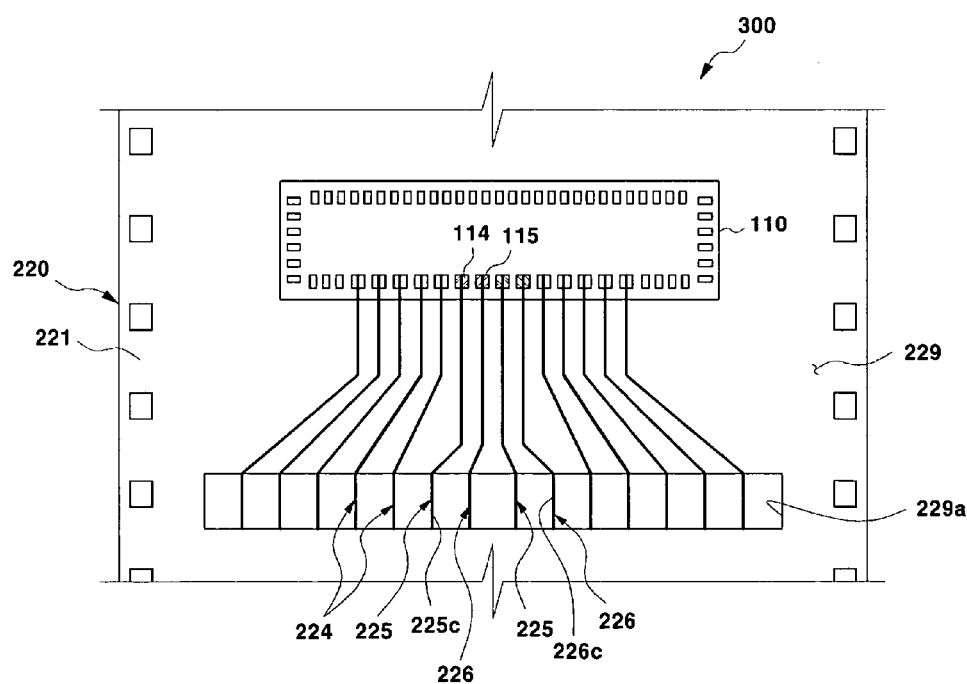
FIG. 8 is a plan view of another example tape package having the semiconductor chip of FIG. 5.

FIG. 8 is a plan view of another example tape package 300 having the semiconductor chip 110 of FIG. 5. The tape package 300 may be the same as the tape package 200, except for the shape of the input wiring patterns. The detailed description of output wiring patterns is omitted herein for purposes of brevity; a tape package 300 having input wiring patterns is illustrated in FIG. 8.

Referring to FIG. 8, the tape package 300 may have power wiring patterns 225 and ground wiring patterns 226. Each of the power wiring patterns 225 and ground wiring patterns 226 may be formed in approximately a straight line, so that the tape package 300 is configured for improved heat radiation through the power wiring patterns 225 and ground wiring patterns 226.

The route of heat transfer or radiation may correlate with distance. For effective heat radiation, the power wiring patterns 225 and ground wiring patterns 226 may be formed of straight lines. The power wiring patterns 225 and ground wiring patterns 226 may run straight before the connection pads 225c and 226c, which are exposed through an opening 229a of a protection layer 229. The signal wiring patterns 224 may be also formed as straight lines.

Figure 9A:
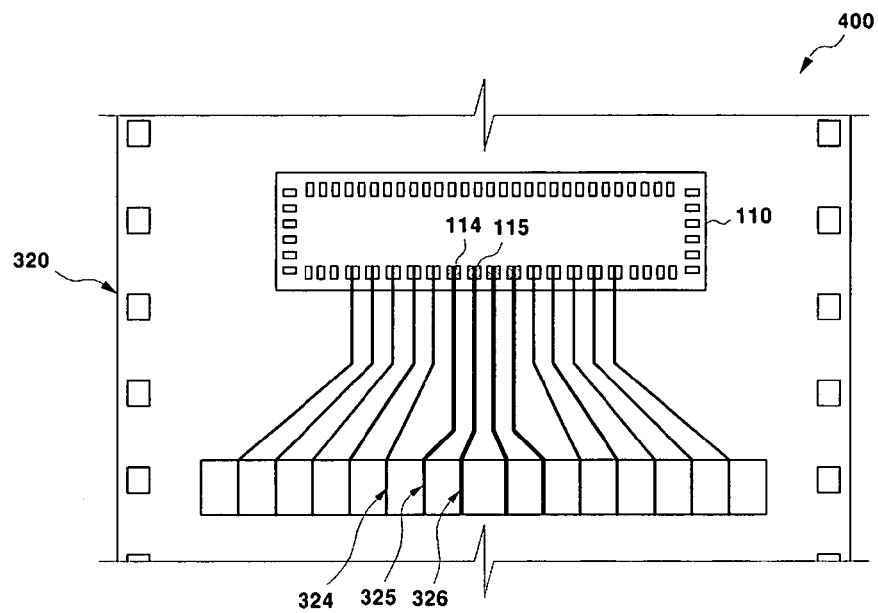
FIG. 9A is a plan view of another example tape package having the semiconductor chip of FIG. 5.
Figure 9B:
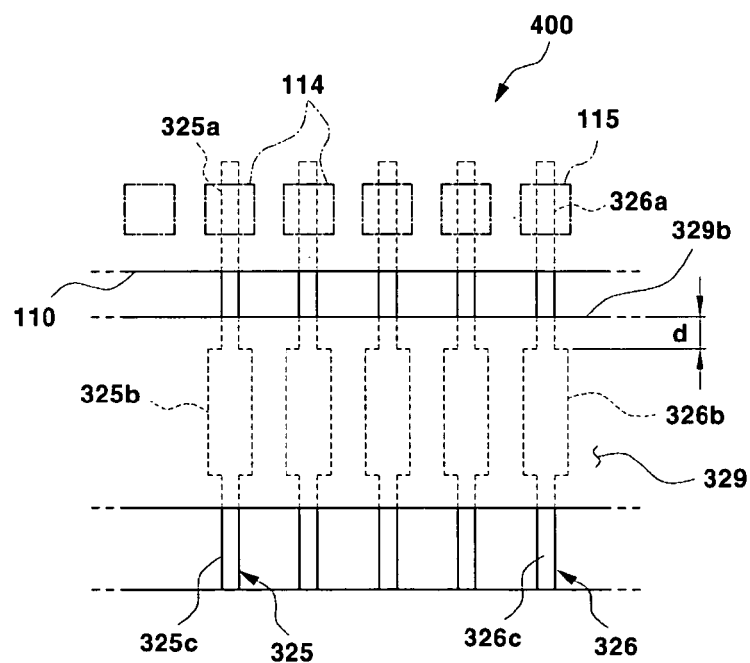
FIG. 9B is a partially enlarged view of power and ground wiring patterns in FIG. 9A.

FIG. 9A is a plan view of another example tape package 400 having the semiconductor chip 110 of FIG. 5; and FIG. 9B is a partially enlarged view of power and ground wiring patterns 325 and 326 in FIG. 9A. Referring to FIGS. 9A and 9B, the tape package 400 may have power wiring patterns 325 and ground wiring patterns 326. The width of the power and ground wiring patterns 325, 326 may be formed so as to be wider than the width of the signal wiring patterns 324. The route of heat transfer or radiation may correlate with area. The increased areas of the power and ground wiring patterns 325, 326 may lead to improved heat radiation characteristics of the tape package 400.

Since substrate pads 325a, 325b of the power wiring patterns 325 and ground wiring patterns 326 are connected to the power pads 114 and ground pads 115 of a semiconductor chip 110, the substrate pads 325a and 325b may have limitations with increasing width. However, intermediate portions 325b and 326b which are covered with a protection layer 329 may have a possibility of increasing the width. The width of the intermediate portions 325b and 326b of the power wiring patterns 325 and ground wiring patterns 326 may be larger than the width of the substrate pads 325a and 326a. The protection layer 129 may have a tolerance (d) of ±150 μm from a standard level 329b. The increased width of the intermediate portions 325b and 326b may be spaced about 150 μm away from the standard level 329b.

In an alternative, the width of the intermediate portions of the signal wiring patterns 324 may be larger than that of substrate pads 325a, 325b.

Figure 10:
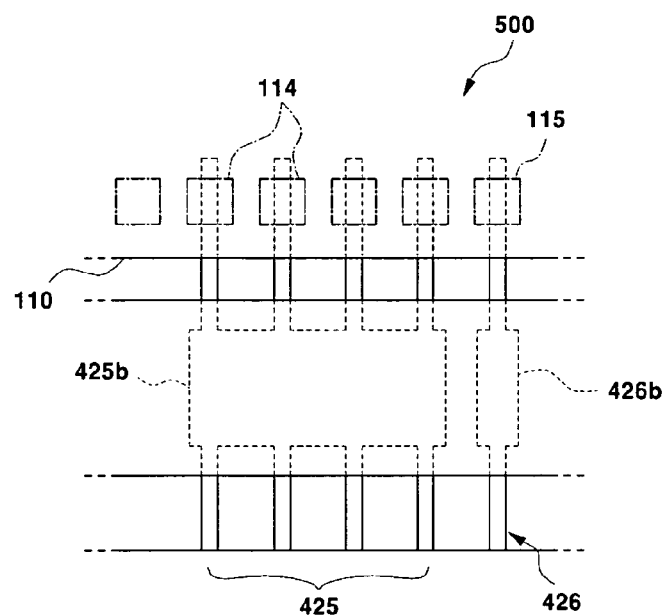
FIG. 10 is a partially enlarged view of another example tape package having the semiconductor chip of FIG. 5.

FIG. 10 is a partially enlarged view of another example tape package 500 having the semiconductor chip 110 of FIG. 5. Referring to FIG. 10, the tape package 500 may include power wiring patterns 425 and/or ground wiring patterns 426, which may be formed integrally in the same group. As described above, power pads 114 and ground pads 115 of a semiconductor chip 110 may be grouped according to the used voltage. The intermediate portions of input wiring patterns connected to input pads in at least one group may be integrally formed. The input pads may be power pads or ground pads, and the input wiring patterns may be power wiring patterns or ground wiring patterns. The groups may be spaced from each other, for example. In this example, intermediate portions 425b of power wiring patterns 425 may be integrally formed and separated from an intermediate portion 426b of an adjacent ground wiring pattern 426.

Figure 11:
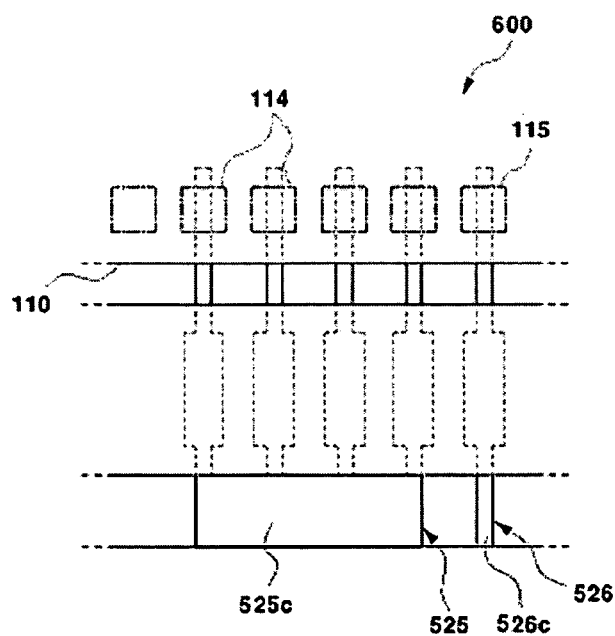
FIG. 11 is a partially enlarged view of another example tape package having the semiconductor chip of FIG. 5.

FIG. 11 is a partially enlarged view of another example tape package 600 having the semiconductor chip 110 of FIG. 5. Referring to FIG. 11, the tape package 600 may include an integral connection pad 525c of a power wiring pattern 525. Heat generated from the semiconductor chip 110 may therefore be effectively radiated through the power wiring patterns 525 and ground wiring patterns 526.

The connection pad 525c of the power wiring patterns 525 may be separated from a connection pad 526c of a ground wiring pattern 526. Although this example illustrates the integral connection pad 525c of the power wiring patterns 525, it may be not limited in this regard.

Figure 12:
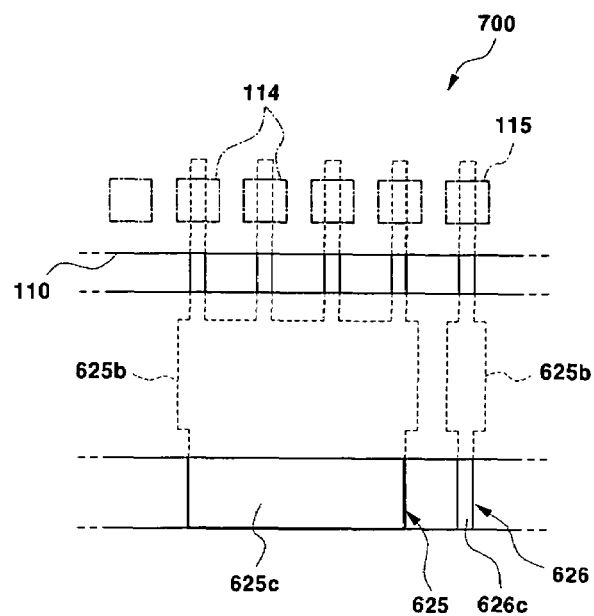
FIG. 12 is a partially enlarged view of another example tape package having the semiconductor chip of FIG. 5.

FIG. 12 is a partially enlarged view of another example tape package 700 having the semiconductor chip 110 of FIG. 5. Referring to FIG. 12, a tape package 700 may include an integral intermediate portion 625b and a connection pad 625c of power wiring patterns 625. Although this example shows the integral intermediate portion 625b and connection pad 625c of the power wiring patterns 625, it may be not limited in this regard. The intermediate portions 625b and connection pads 625c of the power wiring patterns 625 may be separated from an intermediate portion 626b and a connection pad 626c of an adjacent ground wiring pattern 626.

Figure 13:
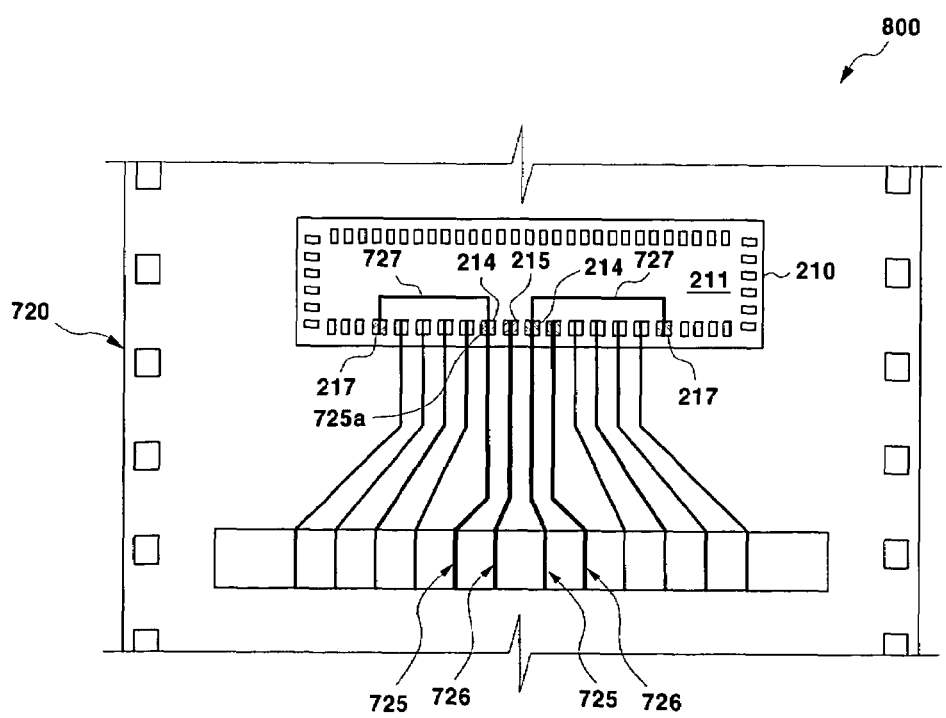
FIG. 13 is a plan view of a tape package having a semiconductor chip in accordance with another example embodiment of the present invention.

FIG. 13 is a plan view of a tape package 800 having a semiconductor chip 210 in accordance with another example embodiment of the present invention. Referring to FIG. 13, the tape package 800 may include a semiconductor chip 210 and a tape wiring substrate 720 flip chip bonded to the semiconductor chip 210.

Input pads 212 of the semiconductor chip 210 may include at least one power dissipating pad 217. The power dissipating pad 217 may be spaced from power pads 214 and ground pads 215. For example, the power dissipating pad 217 may be arranged at either side of the power and ground pads 214, 215.

Input wiring patterns 723 of a tape wiring substrate 720 may include an inner wiring pattern 727. The inner wiring pattern 727 connects the power dissipating pad 217 to the power pad 214. In one example, the inner wiring patterns 727 may be formed within a chip mounting area. One end of the inner wiring pattern 727 may be connected to a substrate pad 725a of a power wiring pattern 725, and the other end of the inner wiring pattern 727 may be connected to the power dissipating pad 217 using bumps. The inner wiring pattern 727 may be covered with a protection layer except for the ends thereof.

The inner wiring pattern 727 provides power from the power pad 214 to the power dissipating pad 217, thereby stably supplying power to the edges of the active surface 211. The inner wiring pattern 727 may also radiate heat generated from the power dissipating pad 217 to the power wiring pattern 725. The tape wiring substrate 720 may be the same as the tape wiring substrates of FIGS. 6 through 12 other than having the inner wiring pattern 727.

In accordance with example embodiments of the present invention, input pads of a semiconductor chip may include power pads and ground pads arranged at a central area of one longer side of an active surface of the semiconductor chip. Power wiring patterns and ground wiring patterns connected to the power pads and ground pads may have reduced length and increased width. Heat generated from the semiconductor chip may be effectively radiated externally through the power wiring patterns and ground wiring patterns connected to the power pads and ground pads.

The power pads and ground pads may be grouped according the used voltage. Intermediate portions and/or connection pads of input wiring patterns connected to input pads of at least one group may be integrally formed, thereby effectively radiating heat generated from the semiconductor chip to the external environment.

Although example, non-limiting embodiments of the present invention have been described in detail hereinabove, it should be understood that many variations and/or modifications of the basic inventive concepts taught herein, which may appear to those skilled in the art, will fall within the spirit and scope of the example embodiments of the present invention, as defined in the appended claims.

What is claimed is:

1. A semiconductor chip, comprising:
   a plurality of input pads along at least one edge among edges of an active surface, the input pads including power pads and ground pads; and
   a plurality of output pads along edges of the active surface, outside of the input pads,
   wherein the power pads and the ground pads are located at a central area of the at least one edge.

2. The semiconductor chip of claim 1, wherein
   the input pads include at least one signal pad, and
   the signal pad is arranged at either side of the power and ground pads.

3. The semiconductor chip of claim 1, wherein
   each of the power pads and the ground pads is grouped according to a voltage used.

4. The semiconductor chip claim 1, wherein
   the active surface has opposing longer sides, and
   the input pads are arranged at one of the opposing longer sides.

5. The semiconductor chip of claim 4, wherein
   the input pads include at least power dissipating pad, and
   the power dissipating pad is spaced away from the central area at the one edge where the power pads and ground pads are located.

6. A tape package, comprising:
   the semiconductor chip of claim 1,
   a tape wiring substrate, including:
      a base film having a chip mounting area,
      a wiring pattern connected to the input and output pads via a bump and including input wiring patterns extending to one side of the base film from the chip mounting area, and output wiring patterns extending to the other side of the base film from the chip mounting area, and
      a protection layer arranged on the wiring pattern so as to expose ends of the wiring patterns, and
   an encapsulant sealing a bonded portion of the semiconductor chip and tape wiring substrate.

7. The package of claim 6, wherein
   a given input pad includes at least one signal pad, and the signal pad is arranged at either side of the power and ground pads.

8. The package of claim 7, wherein
the input wiring pattern includes power wiring patterns connected to the power pads, ground wiring patterns connected to the ground pads and signal wiring patterns connected to the signal pads,
and each of the power patterns and ground patterns is arranged so as to extend in approximately a straight line.

9. The package of claim 8, wherein
the input wiring pattern includes a substrate pad connected to the input pad via the bump, an intermediate portion extending from the substrate pad and covered with the protection layer, and a connection pad extending from the intermediate portion and exposed through the protection layer,
the connection pad is connected to a printed circuit board, and
the width of the intermediate portion is wider than the width of the substrate pad.

10. The package of claim 9, wherein the width of the intermediate portion of the power wiring patterns and ground wiring patterns is wider than the width of the substrate pad of the power wiring patterns and ground wiring patterns.

11. The package of claim 9, wherein each of the power pads and the ground pads are grouped according to a given voltage used.

12. The package of claim 11, wherein the intermediate portions of the input wiring patterns connected to the input pads of at least one group are integrally formed.

13. The package of claim 11, wherein the connection pads of the input wiring patterns connected to the input pads of at least one group are integrally formed.

14. The package of claim 11, wherein the intermediate portions and the connection pads of the input wiring patterns connected to the input pads of at least one group are integrally formed.

15. The package of claim 9, wherein
the input pads further includes at least one power dissipating pad, and
the power dissipating pad is located a given distance from the central area of the one edge where the power pads and ground pads are located.

16. The package of claim 15, wherein
a given input wiring pattern further includes an inner wiring pattern formed within the chip mounting area,
the inner wiring pattern is connected to the substrate pad of the power wiring pattern and the power dissipating pad via a bump.

17. The package of claim 16, wherein the power dissipating pad is located at either side of the central area of the one edge.

18. A tape wiring substrate for a semiconductor chip having input pads and output pads provided on an active surface, the input pads being arranged on one edge of the active surface, the input pads including power pads and ground pads, the power and ground pads being provided in a central area of the one edge, the tape wiring substrate comprising:
a base film having a chip mounting area;
a wiring pattern connected to the plurality of input pads and output pads via a bump, the wiring pattern including a plurality of input wiring patterns extending to one side of the base film from the chip mounting area and a plurality of output wiring patterns extending to the other side of the base film from the chip mounting area; and
a protection layer provided on the wiring pattern, exposing ends of the wiring patterns, wherein each of the input wiring patterns extends in an approximately straight line.

19. The tape wiring substrate of claim 18, wherein
a given input wiring pattern includes a plurality of wiring patterns connected to the power pads, a plurality of ground wiring patterns connected to the ground pads, and signal wiring patterns connected to the signal pads, and
each of the power wiring patterns and ground wiring patterns is arranged so as to extend in approximately a straight line.

20. The tape wiring substrate of claim 19, wherein
a given input wiring pattern includes a substrate pad connected to the input pad via the bump, an intermediate portion extending from the substrate pad and covered with the protection layer, and a connection pad extending from the intermediate portion and exposed through the protection layer,
the connection pad is connected to a printed circuit board, and
the width of the intermediate portion of the input wiring pattern is wider than the width of the substrate pad.

21. The tape wiring substrate of claim 20, wherein the width of the intermediate portion of the power wiring patterns and ground wiring patterns is wider than the width of the substrate pad of the power wiring patterns and ground wiring patterns.

22. The tape wiring substrate of claim 21, wherein each of the power pads and ground pads is grouped according to a given voltage used.

23. The tape wiring substrate of claim 22, wherein the intermediate portions of the input wiring patterns of at least one group are integrated with each other.

24. The tape wiring substrate of claim 22, wherein the connection pads of the input wiring patterns of at least one group are integrated with each other.

25. The tape wiring substrate of claim 22, wherein the intermediate portions and the connection pads of the input wiring patterns of at least one group are integrally formed.

26. The tape wiring substrate of claim 19, wherein
a given input wiring pattern further includes an inner wiring pattern formed within the chip mounting area, and
the inner wiring pattern is connected to the substrate pad of the power wiring pattern and the power dissipating pad via the bump.

27. A semiconductor chip, comprising:
a plurality of input pads located at a central area of one edge of an active surface, the input pads including power pads and ground pads; and
a plurality of output pads along a periphery of the active surface.

28. The semiconductor chip of claim 27, further comprising:
at least one signal pad arranged at either side of the power and ground pads.

29. The semiconductor chip of claim 27, wherein each of the power pads and the ground pads is grouped according to a voltage used.

30. A tape package, comprising:
a semiconductor chip including input pads and output pads along edges of an active surface, the input pads located at one edge of the active surface and including power pads and ground pads that are centrally located at the one edge, a tape wiring substrate connected to the input and output pads of the semiconductor chip via a bump, and an encapsulant sealing a bonded portion of the semiconductor chip and tape wiring substrate.

31. The package of claim 30, wherein a given input pad includes at least one signal pad, and the signal pad is arranged at either side of the power and ground pads.

32. The package of claim 31, wherein the tape wiring substrate includes an input wiring pattern having a plurality of power wiring patterns connected to the power pads, a plurality of ground wiring patterns connected to the ground pads and a plurality of signal wiring patterns connected to the signal pads, and each of the power patterns and ground patterns is arranged so as to extend in approximately a straight line.

33. A tape wiring substrate for a semiconductor chip, comprising:

a wiring pattern connected to a plurality of input pads and output pads of the semiconductor chip via a bump, the wiring pattern including a plurality of input wiring patterns and a plurality of output wiring patterns, and a protection layer exposing ends of the input and output wiring patterns, wherein each of the input wiring patterns extends in an approximately straight line.

34. The substrate of claim 33, wherein a given input wiring pattern includes a plurality of wiring patterns connected to the power pads, a plurality of ground wiring patterns connected to the ground pads, and a plurality of signal wiring patterns connected to the signal pads, and each of the power wiring patterns and ground wiring patterns is arranged so as to extend in approximately a straight line.

* * * * *